(12) United States Patent
Chen et al.

(10) Patent No.: US 8,819,515 B2
(45) Date of Patent: Aug. 26, 2014

(54) MIXED DOMAIN FFT-BASED NON-BINARY LDPC DECODER

(75) Inventors: Lei Chen, Santa Clara, CA (US); Zongwang Li, Santa Clara, CA (US); Johnson Yen, Fremont, CA (US); Shaohua Yang, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 278 days.

(21) Appl. No.: 13/340,951

(22) Filed: Dec. 30, 2011

(65) Prior Publication Data
US 2013/0173988 A1    Jul. 4, 2013

(51) Int. Cl.
*H03M 13/00*    (2006.01)

(52) U.S. Cl.
USPC ............................. 714/752; 714/786; 714/799

(58) Field of Classification Search
CPC .......... H03M 13/1125; H03M 13/114; H03M 13/116; H03M 13/1171
USPC .................. 714/752, 780, 794–796, 786, 799
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | Mccalissister | |
| 6,145,110 A | 11/2000 | Khayrallah | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Esaw Abraham
(74) *Attorney, Agent, or Firm* — Hamilton DeSanctis & Cha

(57) ABSTRACT

Various embodiments of the present invention are related to methods and apparatuses for decoding data, and more particularly to methods and apparatuses for decoding data in a mixed domain FFT-based non-binary LDPC decoder. For example, in one embodiment an apparatus includes a message processing circuit operable to process variable node messages and check node messages in a log domain, and a check node calculation circuit in the low density parity check decoder operable to perform a Fast Fourier Transform-based check node calculation in a real domain. The message processing circuit and the check node calculation circuit perform iterative layer decoding.

20 Claims, 5 Drawing Sheets

(56) References Cited

U.S. PATENT DOCUMENTS

| | | | |
|---|---|---|---|
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,191,378 B2 | 3/2007 | Eroz | |
| 7,203,887 B2 | 4/2007 | Eroz | |
| 7,243,287 B2 * | 7/2007 | Cameron et al. | 714/752 |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,464,317 B2 * | 12/2008 | Cameron et al. | 714/755 |
| 7,475,103 B2 * | 1/2009 | Novichkov et al. | 708/495 |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,676,734 B2 * | 3/2010 | Yamagishi | 714/780 |
| 7,702,986 B2 | 4/2010 | Bjerke | |
| 7,734,981 B2 * | 6/2010 | Esumi et al. | 714/752 |
| 7,752,523 B1 | 7/2010 | Chaichanavong | |
| 7,752,531 B2 * | 7/2010 | Patapoutian et al. | 714/795 |
| 7,779,325 B2 | 8/2010 | Song | |
| 7,802,172 B2 | 9/2010 | Vila Casado et al. | |
| 7,941,736 B2 * | 5/2011 | Park et al. | 714/800 |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,201,051 B2 | 6/2012 | Tan | |
| 8,237,597 B2 | 8/2012 | Liu | |
| 8,261,171 B2 | 9/2012 | Annampedu | |
| 8,291,284 B2 | 10/2012 | Savin | |
| 8,295,001 B2 | 10/2012 | Liu | |
| 8,495,119 B2 * | 7/2013 | Novichkov et al. | 708/277 |
| 2008/0069373 A1 | 3/2008 | Jiang et al. | |
| 2008/0304558 A1 | 12/2008 | Zhu et al. | |
| 2009/0132893 A1 | 5/2009 | Miyazaki | |
| 2009/0185643 A1 | 7/2009 | Fitzpatrick | |
| 2011/0167227 A1 | 7/2011 | Yang | |
| 2011/0252286 A1 | 10/2011 | Li et al. | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"---IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2Λm) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/174,453, filed Jun. 30, 2011, Johnson Yen, Unpublished.

U.S. Appl. No. 13/186,234, filed Jul. 19, 2011, Haitao Xia, Unpublished.

U.S. Appl. No. 13/213,751, filed Aug. 19, 2011, Fan Zhang, Unpublished.

U.S. Appl. No. 13/300,078, filed Nov. 18, 2011, Chung-Li Wang, Unpublished.

U.S. Appl. No. 13/227,416, filed Sep. 7, 2011, Lei Chen, Unpublished.

U.S. Appl. No. 13/305,551, filed Nov. 28, 2011, Yang Han, Unpublished.

U.S. Appl. No. 13/296,022, filed Nov. 14, 2011, Victor Krachkovsky, Unpublished.

U.S. Appl. No. 13/327,279, filed Dec. 15, 2011, Wei Feng, Unpublished.

(56) References Cited

OTHER PUBLICATIONS

U.S. Appl. No. 13/174,537, filed Jun. 30, 2011, Anantha Raman Krishnan, Unpublished.
U.S. Appl. No. 13/316,741, filed Dec. 12, 2011, Yang Han, Unpublished.
U.S. Appl. No. 13/284,767, filed Oct. 28, 2011, Fan Zhang, Unpublished.
U.S. Appl. No. 13/302,119, filed Nov. 22, 2011, Lei Chen, Unpublished.
U.S. Appl. No. 13/227,544, filed Sep. 8, 2011, Shaohua Yang, Unpublished.
U.S. Appl. No. 13/283,549, filed Oct. 27, 2011, Wu Chang, Unpublished.
U.S. Appl. No. 13/305,510, filed Nov. 28, 2011, Lei Chen, Unpublished.
U.S. Appl. No. 13/113,219, filed May 23, 2011, Yang Han, Unpublished.
U.S. Appl. No. 13/180,495, filed Jul. 11, 2011, Chung-Li Wang, Unpublished.
U.S. Appl. No. 13/295,150, filed Nov. 14, 2011, Zongwang Li, Unpublished.
U.S. Appl. No. 13/316,858, filed Dec. 12, 2011, Zongwang Li, Unpublished.
U.S. Appl. No. 13/284,730, filed Oct. 28, 2011, Fan Zhang, Unpublished.
U.S. Appl. No. 13/269,852, filed Oct. 10, 2011, Haitao Xia, Unpublished.
U.S. Appl. No. 13/269,832, filed Oct. 10, 2011, Haitao Xia, Unpublished.
U.S. Appl. No. 13/239,683, filed Sep. 22, 2011, Changyou Xu, Unpublished.
U.S. Appl. No. 13/171,615, filed Jun. 29, 2011, Bradley D. Seago, Unpublished.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Joint Code-Encoder Design for LDPC Coding System VLSI Implementation", ISCAS, IEEE pp. 389-392, May 2004.
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Design of VLSI Implementation-Oriented LDPC Codes", IEEE, pp. 670-673, 2003.
Zhong, "Block-LDPC: A Practical LDPC Coding System Design Approach", IEEE Trans. On Circuits, Regular Papers, vol. 5, No. 4, pp. 766-775, Apr. 2005.
Condo, Carlo et al "A Flexible NoC-Based LDPC Code Decoder Implementation and Bandwidth Reduction Methods" IEEE Nov. 2, 2011 pp. 1-8.
Fewer, et al "A Versatile Variable Rate LDPC Codec Architecture" IEEE vol. 54, No. 10, Oct. 1, 2007.
Hongxin, et al "Reduced-Complexity Decoding of Q-ary LDPC codes for Magnetic Recording" IEEE vol. 39, No. 2, Mar. 1, 2003.
Spagnol, et al "Hardward Implementation of GF(2 m) LDPC Decoders" IEEE vol. 56, No. 12. Dec. 1, 2009.

\* cited by examiner

MIXED DOMAIN FFT-BASED NON-BINARY LDPC DECODER

BACKGROUND

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

A need remains for more efficient and accurate LDPC decoders.

BRIEF SUMMARY

Various embodiments of the present invention are related to methods and apparatuses for decoding data, and more particularly to methods and apparatuses for decoding data in a mixed domain FFT-based non-binary LDPC decoder. For example, in one embodiment an apparatus includes a message processing circuit operable to process variable node messages and check node messages in a log domain, and a check node calculation circuit in the low density parity check decoder operable to perform a Fast Fourier Transform-based check node calculation in a real domain. The message processing circuit and the check node calculation circuit perform iterative layer decoding. In some embodiments, the message processing circuit includes a summation circuit that adds variable node values for the connected layer to check node values for the connected layer to yield soft log likelihood ratio values of each symbol in a Galois Field for the connected layer. The message processing circuit also includes a shifter that shifts the soft log likelihood ratio values by the difference between a current layer and the connected layer to yield total soft log likelihood ratio values for the current layer, and a subtraction circuit that subtracts check node values for the current layer from the total soft log likelihood ratio values for the current layer to yield variable node values for the current layer. In some instances, a transformation circuit converts the variable node values for the current layer from the log domain to the real domain or probability domain. In some embodiments, the check node calculation circuit includes an FFT circuit that operates in the real domain on the variable node values for the current layer, a magnitude and sign calculation circuit operable to determine the signs and magnitudes of the output of the FFT circuit, and a check node memory that stores the signs and magnitudes. Some embodiments calculate check node values for the connected layer and for the current layer based on the values in the check node memory using exponential calculation circuits to calculate exponential values of the magnitudes and to apply the signs to corresponding exponential values. The results are processed in inverse Fast Fourier Transform circuits and transformed from the real domain to the log domain.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Various embodiments of the present invention are related to methods and apparatuses for decoding data, and more particularly to methods and apparatuses for decoding data in a mixed domain Fast Fourier Transform (FFT)-based non-binary LDPC decoder. The mixed domain LDPC decoder performs some of the decoding operations in the log domain and some in the probability domain, thereby achieving some of the benefits of both belief propagation (BP) decoding and FFT-based decoding of non-binary LDPC codes, while avoiding some of the disadvantages that may be inherent in a purely BP decoder or FFT decoder. For example, the mixed domain LDPC decoder benefits from the stability and simplicity of log domain handling of variable node and check node messages, using addition and subtraction rather than multiplication and division to process messages, as well as reduced sensitivity to finite precision when working in the log domain. By using probability domain FFT calculations for probabilities, the complexity of the mixed domain LDPC decoder is reduced from $Nt(2^P)^2$ as in BP decoders to $Nt(2^P)P$, where N is the code length, t is the mean weight of the columns, and P defines the dimension of the Galois Field $GF(2^P)$. The FFT calculation is a p-dimension 2-point calculation using addition and subtraction. The mixed domain LDPC decoder also achieves excellent error performance with the FFT calculation which does not use approximation, as compared to other complexity-reduced algorithms such as min-max decoding. By performing the FFT calculation in the probability domain and handling variable node messages and check node messages in the log domain, the mixed domain LDPC decoder provides excellent error performance with relatively simple and stable hardware.

The mixed domain LDPC decoder decodes quasi-cyclic LDPC codes using either a regular or irregular parity check H matrix having an array of circulant sub-matrices, or cyclically shifted versions of identity matrices and null matrices with different cyclical shifts. The H matrix is constructed based on the finite Galois Field $GF(2^P)$, for example with the form:

$$P_{i,j} = \begin{bmatrix} 0 & \alpha & 0 & \cdots & 0 \\ 0 & 0 & \alpha & \cdots & 0 \\ \vdots & \vdots & \vdots & \ddots & \vdots \\ 0 & 0 & 0 & \cdots & \alpha \\ \alpha & 0 & 0 & \cdots & 0 \end{bmatrix}$$

Figure 1:
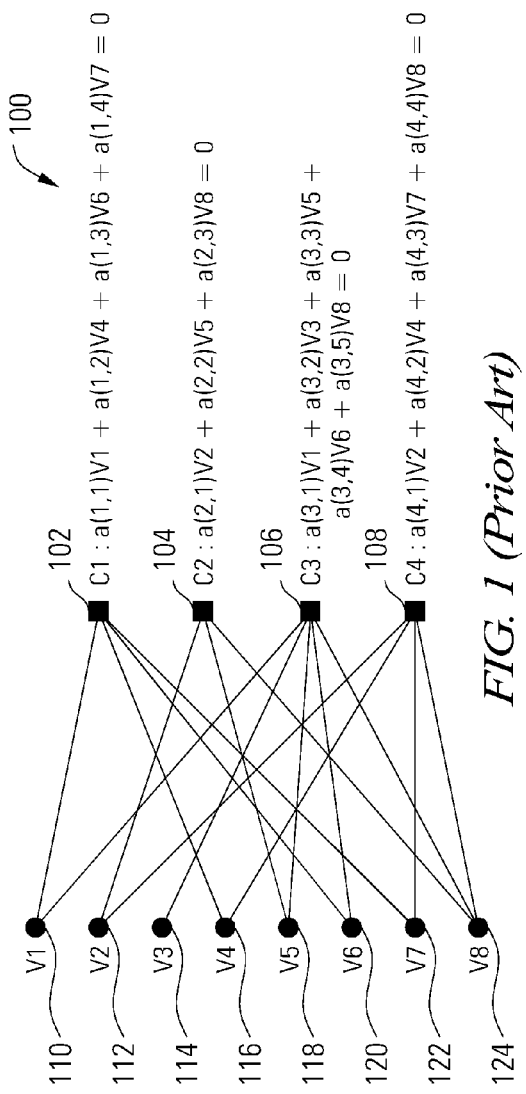
FIG. 1 depicts a Tanner graph of an example prior art LDPC code.
Figure 2:
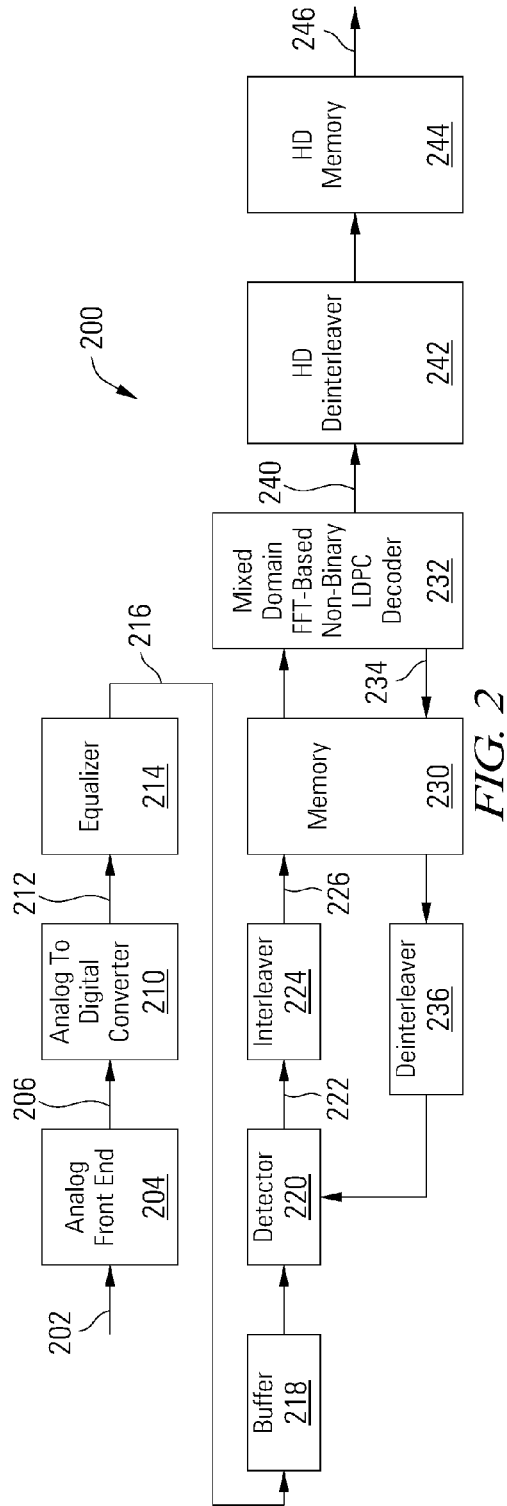
FIG. 2 depicts a block diagram of a read channel which may be used to retrieve or receive stored or transmitted data in accordance with various embodiments of the present invention.

Although the mixed domain LDPC decoder disclosed herein is not limited to any particular application, several examples of applications are presented herein that benefit from embodiments of the present invention. Turning to FIG. 2, a read channel 200 is used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. In some cases, the gain of a variable gain amplifier included as part of analog front end 204 may be modifiable, and the cutoff frequency and boost of an analog filter included in analog front end 204 may be modifiable. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In these embodiments, the detected output 222 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source. Data detector 220 yields a detected output 222 that includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art.

The detected output 222 from data detector 220 is provided to an interleaver 224 that protects data against burst errors. Burst errors overwrite localized groups or bunches of bits. Because LDPC decoders are best suited to correcting errors that are more uniformly distributed, burst errors can overwhelm LDPC decoders. The interleaver 224 prevents this by interleaving or shuffling the detected output 222 from data detector 220 to yield an interleaved output 226 which is stored in a memory 230. Interleaver 224 may be any circuit known in the art that is capable of shuffling data sets to yield a rearranged data set. The interleaved output 226 from the memory 230 is provided to a mixed domain LDPC decoder 232 which performs parity checks on the interleaved output 226, ensuring that parity constraints established by an LDPC encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the mixed domain LDPC decoder 232.) To perform a global iteration, LLR values 234 from the mixed domain LDPC decoder 232 are stored in memory 230, deinterleaved in a deinterleaver 236 to reverse the process applied by interleaver 224, and provided again to the data detector 220 to allow the data detector 220 to repeat the data detection process, aided by the LLR values 234 from the mixed domain LDPC decoder 232. In this manner, the read channel 200 can perform multiple global iterations, allowing the data detector 220 and mixed domain LDPC decoder 232 to converge on the correct data values.

The mixed domain LDPC decoder 232 also produces hard decisions 240 about the values of the data bits or symbols contained in the interleaved output 226 of the interleaver 224. For binary data bits, the hard decisions may be represented as 0's and 1's. For non-binary or multi-level symbols, in a GF(8) LDPC decoder, the hard decisions may be represented by field elements 000, 001, 010 . . . 111.

The hard decisions 240 from mixed domain LDPC decoder 232 are deinterleaved in a hard decision deinterleaver 242, reversing the process applied in interleaver 224, and stored in a hard decision memory 244 before being provided to a user or further processed. For example, the output 246 of the read channel 200 may be further processed to reverse formatting changes applied before storing data in a magnetic storage medium or transmitting the data across a transmission channel.

Figure 3:
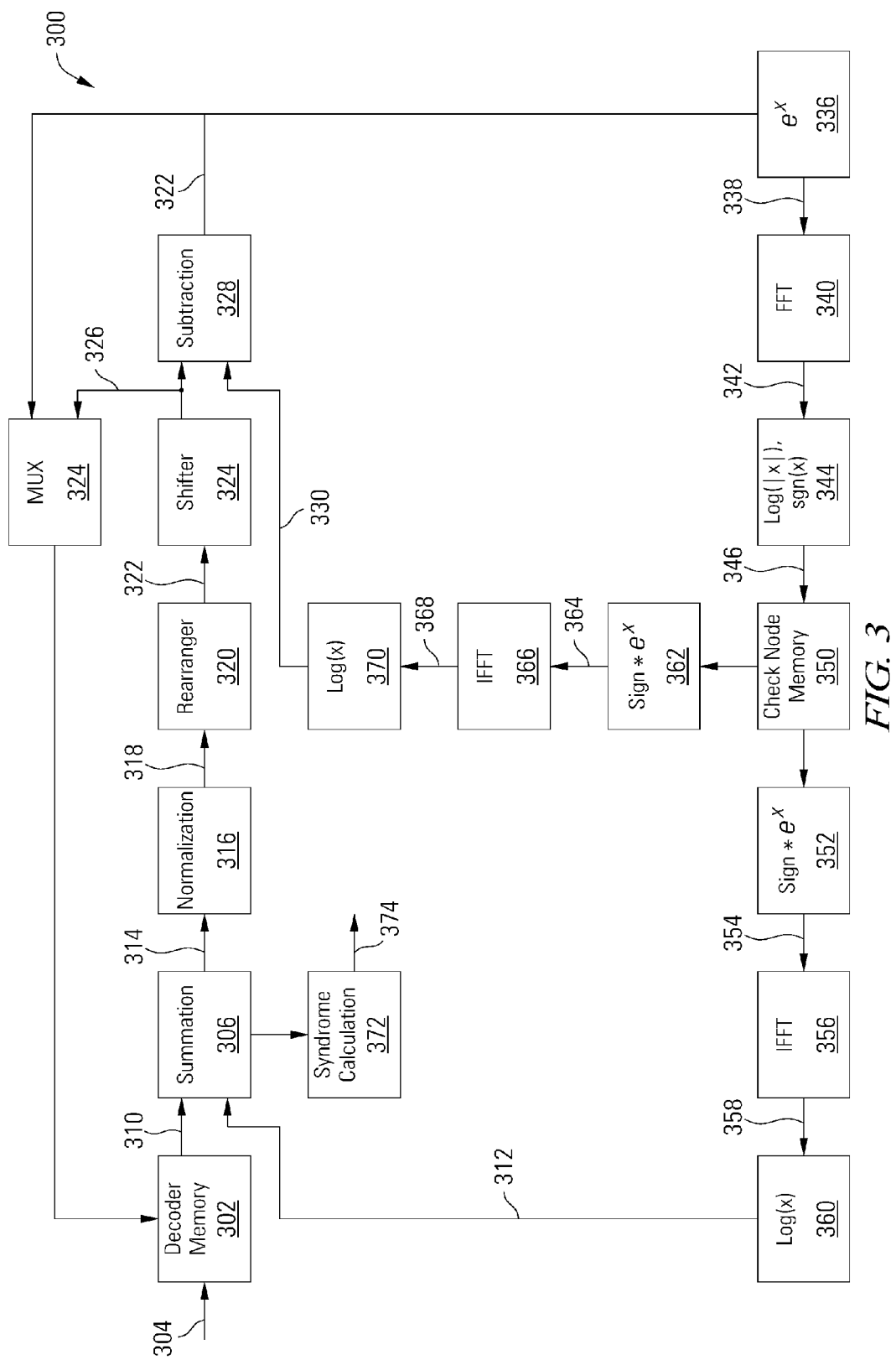
FIG. 3 depicts a mixed domain FFT-based non-binary LDPC decoder in accordance with various embodiments of the present invention.

Turning now to FIG. 3, an example of a mixed domain FFT-based non-binary LDPC layer decoder 300 is disclosed in accordance with various embodiments of the present invention. The mixed mode LDPC decoder 300 processes circulant sub-matrices of the H matrix layer by layer, combining values from a previous layer or connected layer with those of a current layer in an iterative process to update soft LLR output P values indicating the likelihood that a corresponding bit position or group of bit positions has been correctly detected with a particular value for each element of $GF(2^P)$.

Mixed mode LDPC decoder 300 includes decoder memory 302 which stores soft LLR input values from input 304, Q values and soft LLR output P values. The decoder memory 302 is a ping pong memory having multiple banks. A summation circuit 306 adds the connected layer's variable node value (Q values 310 from decoder memory 302, or, in the first local iteration, soft LLR input values from input 304) with the connected layer's check node value (connected layer R values 312) of each symbol of one circulant respectively to obtain the soft LLR values 314 of each symbol for the connected layer. In some embodiments, the summation circuit 306 includes one adder for each element of $GF(2^P)$ to add the connected layer's Q value of each element to the connected layer's R value for that element to obtain the soft LLR value for each element of $GF(2^P)$ in the symbol. For a GF(8) mixed mode LDPC decoder 300, a symbol may have the value of any of the 8 elements of the GF(8), and the summation circuit 306 includes 8 adders to yield 8 soft LLR values representing each element of GF(8) for the symbol. In some embodiments, the summation circuit 306 performs the variable node update according to Equation 1:

$$U_{tp} = L \times \sum_{v=1, v \neq t}^{d_v} v_{pv}, t = 1 \ldots d_v \quad \text{(Eq 1)}$$

where $$\{V_{pv}\}_{v=1\ldots d_v}$$

is the set of messages entering a variable node of degree $d_v$. For example, if three check nodes are connected to a variable node, with three non-zero elements in the column of the H matrix, the degree $d_v$ of the variable node is 3. Thus, $$\{V_{pv}\}_{v=1\ldots d_v}$$

is the 1 ... $d_v$ set of non-zero V messages in row p. L is the channel likelihood, the initial channel LLR values at input 304.

$$\{U_{vp}\}_{v=1\ldots d_v}$$

is the set of output messages for this variable node.

$$\{U_{pc}\}_{c=1\ldots d_c}$$

is the set or input messages for a degree $d_c$ check node.

$$\{U_{pc}\}_{c=1\ldots d_c}$$

is the set of output messages of a degree $d_c$ check node.

The soft LLR values 314 from summation circuit 306 are provided to normalization circuit 316, which compares each of the soft LLR values 314 to identify the minimum value and hard decision, and which subtracts that minimum value from the remaining soft LLR values for each symbol, thereby normalizing the soft LLR values 314 to their minimums and yielding normalized variable node values 318.

The normalized variable node values 318 are provided to rearranger 320 which rearranges normalized variable node values 318 to prepare for the check node update and which applies the permutations specified by the non-zero elements of the H matrix. The permutations are multiplications in the Galois Field. For example, element 2 of the GF multiplied by elements 1, 2, 3, 4, 5, 6 and 7 results in elements 2, 3, 4, 5, 6, 7 and 1, which are permutations of elements 1, 2, 3, 4, 5, 6 and 7. In some embodiments, the rearranger 320 applies the permutation according to Equation 2:

$$vec(U_{pc}) = P_{h(x)} vec(U_{tp}) \quad \text{(Eq 2)}$$

where $P_{h(x)}$ is the permutation specified by the H matrix.

The rearranged variable node values 322 from rearranger 320 are provided to shifter 324 which shifts the rearranged variable node values 322 by the difference between the current layer and the connected layer, effectively transforming the rearranged variable node values 322 from column order to row order with respect to the H matrix. The shifter 324 is a cyclic shifter or barrel shifter which shifts the symbol values in the rearranged variable node values 322 to generate the next circulant sub-matrix, yielding current layer P values 326 which contain the total soft LLR values of the current layer.

The current level P values 326 are provided to subtraction circuit 328 which subtracts the current layer check node value, or R values 330 of the symbols of the current layer, from the current layer P values 326 to yield the updated variable node value of the symbol of the current layer, or current layer Q values 332.

A multiplexer 334 enables the storage of the current layer soft LLR P values 326 and the current layer Q values 332 in decoder memory 302. Based upon the disclosure provided herein, one of ordinary skill in the art will recognize a variety of ways in which the current layer P values 326 and current layer Q values 332 may be stored in decoder memory 302, such as the use of a multiplexer 334 or a multi-port memory.

Prior to calculating check node messages, the current layer Q values 332 are transformed from the log domain to the real domain or probability domain in transformation circuit 336 to prepare for FFT processing in the check node update. The transformation circuit 336 applies exponential function $e^x$ on input x, where the current layer Q values 332 are the input x. The transformation circuit 336 provides probability domain Q values 338 to FFT circuit 340 to perform the check node calculation. The FFT circuit 340 performs a FFT operation on the probability domain Q values 338, yielding FFT output 342.

Figure 4:
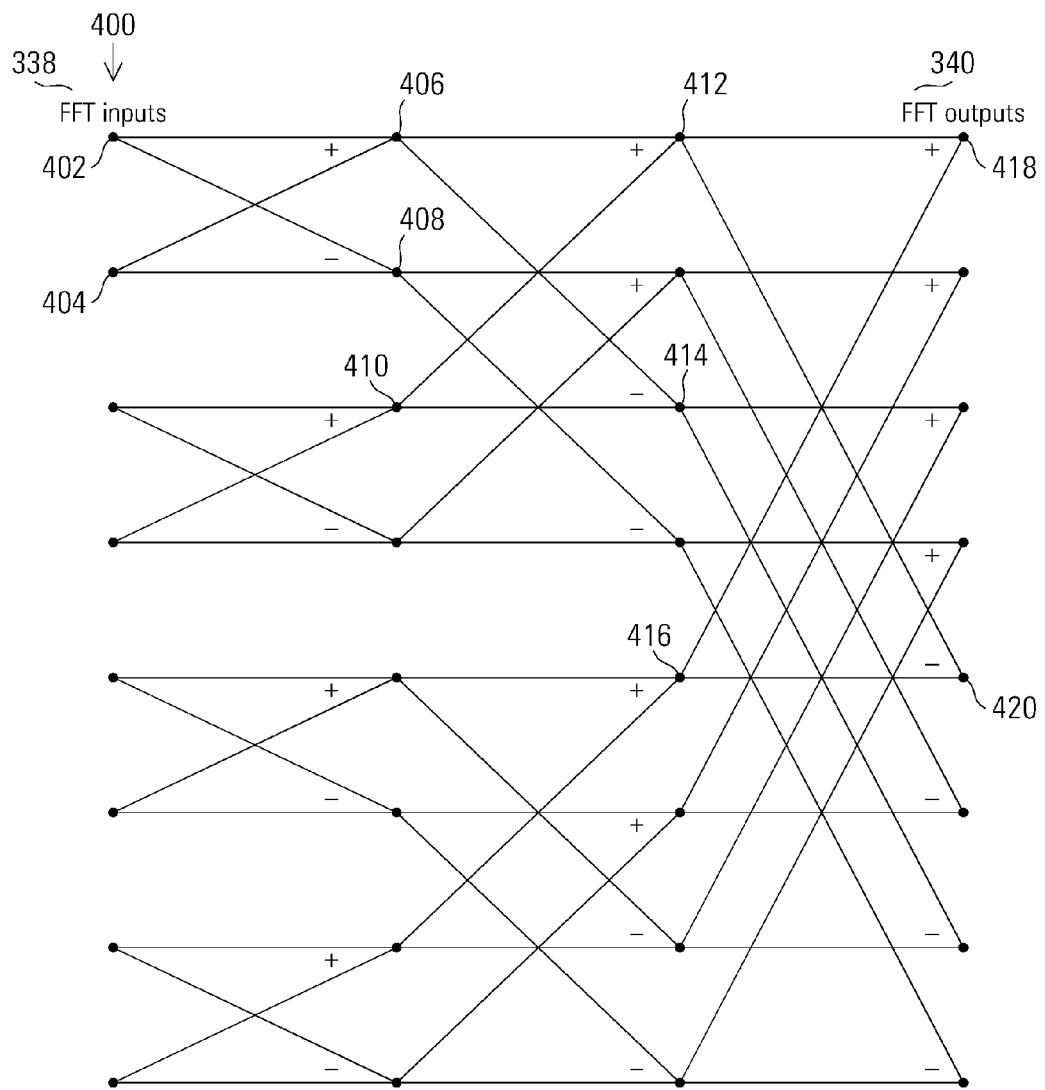
FIG. 4 depicts a butterfly diagram illustrating an FFT calculation in accordance with various embodiments of the present invention.

In some embodiments, FFT circuit 340 is a 3-dimensional two-point FFT for non-binary LDPC code over GF(8). An example of the calculation performed by FFT circuit 340 is illustrated in the diagram of FIG. 4. Each of the 8 elements 400 in GF(8) for a symbol are combined in pairs in addition and subtraction operations. For example, elements 402 and 404 are added to yield element 406 and subtracted to yield element 408. The pairs change in each stage. In the second stage, elements 406 and 410 are added to yield element 412 and subtracted to yield element 414. In the third stage, elements 412 and 416 are added to yield element 418 and subtracted to yield element 420.

Turning back to FIG. 3, the FFT output 342 is provided to a magnitude/sign circuit 344, which yields the absolute values and signs 346 of the FFT output 342 to be stored in check node memory 350. The check node memory 350 stores the LLR values (in the probability domain), or probability values, of each non-zero element in the H matrix. The magnitude/sign circuit 344 may be combined in a single circuit or may comprise a magnitude calculation circuit and a sign calculation circuit. The absolute values and signs 346 for the previous layer are retrieved from check node memory 350 and provided to multiplier 352, which multiplies the exponential function $e^x$ of the absolute values of the FFT output 342 by the signs of the FFT output 342. The output 354 of the multiplier 352 is provided to inverse FFT circuit 356, which performs the inverse operation to FFT circuit 340. In some embodiments, the inverse FFT circuit 356 is a 3-dimensional two-point inverse FFT (IFFT) for non-binary LDPC code over GF(8). The inverse FFT circuit 356 yields connected layer R values 358 in the probability domain to transformation circuit 360, which transforms the connected layer R values 358 from the probability domain to the log domain by applying the log(x) function, yielding connected layer R values 312 in the log domain.

The absolute values and signs 346 for the current layer are retrieved from check node memory 350 and provided to multiplier 362, which multiplies the exponential function ex of the absolute values of the FFT output 342 by the signs of the FFT output 342. The output 364 of the multiplier 362 is provided to IFFT circuit 366, which performs the inverse operation to FFT circuit 340. In some embodiments, the inverse FFT circuit 366 is a 3-dimensional two-point inverse FFT (IFFT) for non-binary LDPC code over GF(8). The IFFT circuit 366 yields current layer R values 368 in the probability domain to transformation circuit 370, which transforms the current layer R values 368 from the probability domain to the log domain by applying the log(x) function, yielding current layer R values 330 in the log domain. The FFT circuit 340, magnitude/sign circuit 344, check node memory 350, multiplier 352, inverse FFT circuit 356, multiplier 362 and IFFT circuit 366 may be referred to collectively as a check node calculation circuit. The summation circuit 306, normalization circuit 316, rearranger 320, shifter 324 and subtraction circuit 328 may be referred to collectively as a message processing circuit. While multipliers 352 and 362 are referred to as multipliers, they may be implemented as exponential calculation circuits that apply a stored sign to the result, and in some embodiments do not multiply values in a conventional multiplication circuit.

A syndrome calculation is performed in a syndrome calculation circuit based on the soft LLR values from the summation circuit 306, and a hard decision 374 is provided.

The probability domain message update for a degree $d_c$ check node is set forth in Equation 3:

$$V_{tp} = F\left(\sum_{c=1, c \neq t}^{d_c} F(U_{pc})\right) t = 1 \ldots d_c \quad \text{(Eq 3)}$$

The Fourier transform of $U_{pc}$ is given by Equation 4:

$$F(U_{pc}) = U_{pc} \times_1 F \times_2 F \ldots \times_p F \quad \text{(Eq 4)}$$

where F is a 2×2 matrix of the second-order Fourier transform given by $$F = \frac{1}{\sqrt{2}} \begin{bmatrix} 1 & 1 \\ 1 & -1 \end{bmatrix} \quad \text{(Eq 5)}$$

and where $Z = U \times_k F$ is defined as, for $(i_1 \ldots i_{k-1}, i_{k+1}, \ldots i_p) \in \{0,1\}^{p-1}$, $$Z[i_1 \ldots i_{k-1}, 0, i_{k+1}, \ldots i_p] = \quad \text{(Eq 6)}$$
$$\frac{1}{\sqrt{2}}(U[i_1 \ldots i_{k-1}, 0, i_{k+1}, \ldots i_p] + U[i_1 \ldots i_{k-1}, 1, i_{k+1}, \ldots i_p])$$

$$Z[i_1 \ldots i_{k-1}, 0, i_{k+1}, \ldots i_p] = \quad \text{(Eq 7)}$$
$$\frac{1}{\sqrt{2}}(U[i_1 \ldots i_{k-1}, 0, i_{k+1}, \ldots i_p] - U[i_1 \ldots i_{k-1}, 1, i_{k+1}, \ldots i_p])$$

Note, however, that for GF(8), p=3, the FFT is a 3-dimension two-point FFT.

Figure 5:
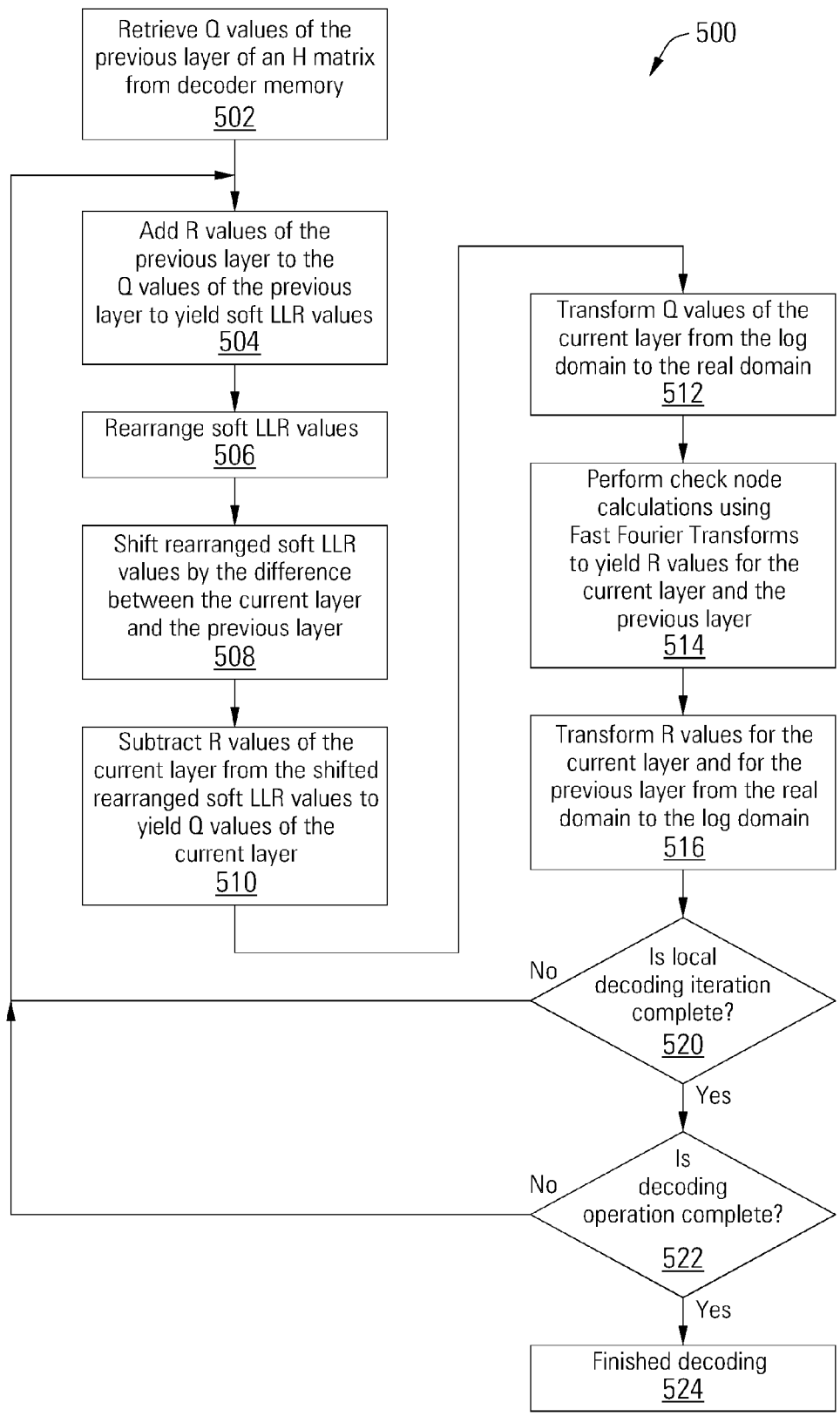
FIG. 5 depicts a flow diagram showing a method for decoding data in a mixed domain FFT-based non-binary LDPC decoder in accordance with various embodiments of the present invention.

Turning to FIG. 5, a flow diagram 500 depicts a method for decoding data in a mixed domain FFT-based non-binary LDPC decoder in accordance with various embodiments of the present invention. The method of FIG. 5, or variations thereof, may be performed in mixed-domain LDPC decoders such as those illustrated in FIG. 3. Following flow diagram 500, Q values of the previous layer of the H matrix are retrieved from the decoder memory. (Block 502) R values of the previous layer are added to the Q values of the previous layer to yield soft LLR values of each symbol in the Galois Field. (Block 504) The soft LLR values are rearranged to yield rearranged soft LLR values. (Block 506) The rearranged soft LLR values are shifted by the difference between the current layer and the previous layer. (Block 508) R values of the current layer are subtracted from the shifted rearranged soft LLR values to yield Q values of the current layer of each symbol in Galois Field, and Q values of current layer are updated in the decoder memory. (Block 510) The Q values of the current layer are transformed from the log domain to the real domain, (block 512) and the check node calculations are performed using Fast Fourier Transforms to yield R values for the current layer and the previous layer. (Block 514) In some embodiments, this includes performing a 3-dimension two-point FFT for non-binary LDPC code over GF(8), finding the magnitude and sign of the result, calculating the sign times exponential of the magnitude for the results, and performing the inverse FFT. The R values for the current layer and for the previous layer are transformed from the real domain to the log domain. (Block 516) A determination is made as to whether the local decoding iteration is complete for the H matrix. (Block 520) If not, the next circulant is prepared and processing continues. If so, a determination is made as to whether the decoding operation is complete. (Block 522) The decoding operation may be determined to be complete when the maximum number of local decoding iterations has been performed, or when data convergence is detected. If the decoding operation is not complete, the next circulant is prepared and processing continues. (Block 504) If it is, the decoding is ended. (Block 524) The syndrome calculation is performed and a hard decision is provided at the output of the mixed domain LDPC decoder.

Figure 6:
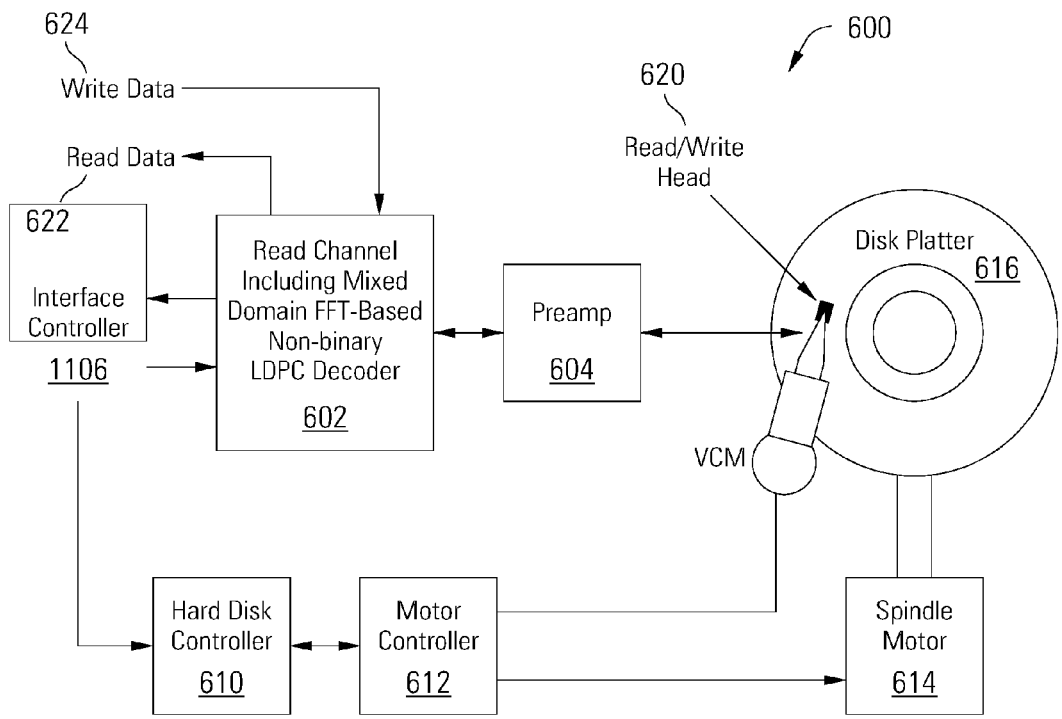
FIG. 6 depicts a storage system including a mixed domain FFT-based non-binary LDPC decoder in accordance with some embodiments of the present invention.

Although the mixed domain LDPC decoder disclosed herein is not limited to any particular application, several examples of applications are presented herein that benefit from embodiments of the present invention. FIG. 6 shows a storage system 600 including a read channel circuit 602 with a mixed domain LDPC decoder in accordance with some embodiments of the present invention. Storage system 600 may be, for example, a hard disk drive. Storage system 600 also includes a preamplifier 604, an interface controller 606, a hard disk controller 610, a motor controller 612, a spindle motor 614, a disk platter 616, and a read/write head assembly 620. Interface controller 606 controls addressing and timing of data to/from disk platter 616. The data on disk platter 616 consists of groups of magnetic signals that may be detected by read/write head assembly 620 when the assembly is properly positioned over disk platter 616. In one embodiment, disk platter 616 includes magnetic signals recorded in accordance with either a longitudinal or a perpendicular recording scheme.

In a typical read operation, read/write head assembly 620 is accurately positioned by motor controller 612 over a desired data track on disk platter 616. Motor controller 612 both positions read/write head assembly 620 in relation to disk platter 616 and drives spindle motor 614 by moving read/write head assembly 620 to the proper data track on disk platter 616 under the direction of hard disk controller 610. Spindle motor 614 spins disk platter 616 at a determined spin rate (RPMs). Once read/write head assembly 620 is positioned adjacent the proper data track, magnetic signals representing data on disk platter 616 are sensed by read/write head assembly 620 as disk platter 616 is rotated by spindle motor 614. The sensed magnetic signals are provided as a continuous, minute analog signal representative of the magnetic data on disk platter 616. This minute analog signal is transferred from read/write head assembly 620 to read channel circuit 602 via preamplifier 604. Preamplifier 604 is operable to amplify the minute analog signals accessed from disk platter 616. In turn, read channel circuit 602 decodes and digitizes the received analog signal to recreate the information originally written to disk platter 616. This data is provided as read data 622 to a receiving circuit. As part of decoding the received information, read channel circuit 602 processes the received signal using a mixed domain LDPC decoder. Such a mixed domain LDPC decoder may be implemented consistent with that disclosed above in relation to FIG. 3. In some cases, the mixed domain LDPC decoding may be done consistent with the flow diagram disclosed above in relation to FIG. 5. A write operation is substantially the opposite of the preceding read operation with write data 624 being provided to read channel circuit 602. This data is then encoded and written to disk platter 616. It should be noted that various functions or blocks of storage system 600 may be implemented in either software or firmware, while other functions or blocks are implemented in hardware.

Figure 7:
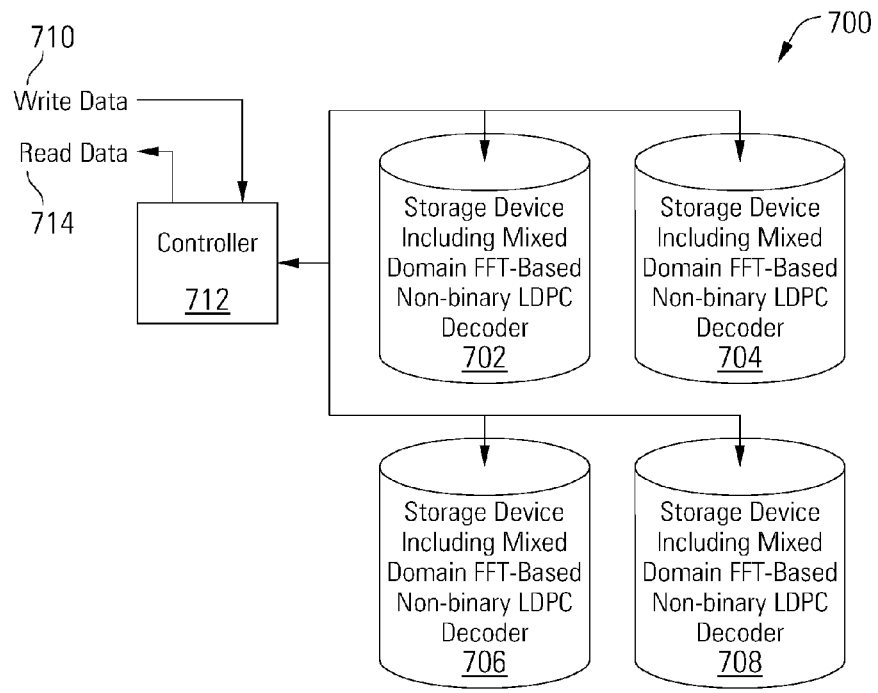
FIG. 7 depicts a virtual storage system including a mixed domain FFT-based non-binary LDPC decoder in accordance with some embodiments of the present invention.

Turning to FIG. 7, a mixed domain LDPC decoder may be integrated into a virtual storage system such as a RAID (redundant array of inexpensive disks or redundant array of independent disks) based storage system 700 that increases stability and reliability through redundancy, combining multiple disks as a logical unit. Data may be spread across a number of disks 702, 704, 706, 708 included in the RAID storage system 700 according to a variety of algorithms and accessed by an operating system as if it were a single disk. For example, data may be mirrored to multiple disks 702-908 in the RAID storage system 700, or may be sliced and distributed across multiple disks 702-908 in a number of techniques. If a small number of disks (e.g., 702) in the RAID storage system 700 fail or become unavailable, error correction techniques may be used to recreate the missing data based on the remaining portions of the data from the other disks (e.g., 704-908) in the RAID storage system 700. The disks 702-908 in the RAID storage system 700 may be, but are not limited to, individual storage systems such as that disclosed above in relation to FIG. 8, and may be located in close proximity to each other or distributed more widely for increased security. In a write operation, write data 710 is provided to a controller 712, which stores the write data 710 across the disks 702-908, for example by mirroring or by striping the write data 710. In a read operation, the controller 712 retrieves the data from the disks 702-908, performing error correction using mixed domain LDPC decoding in either or both the controller 712 and the disks 702-908 and recreating any missing data where possible. The controller 712 then yields the resulting read data 714 as if the RAID storage system 700 were a single disk.

Figure 8:
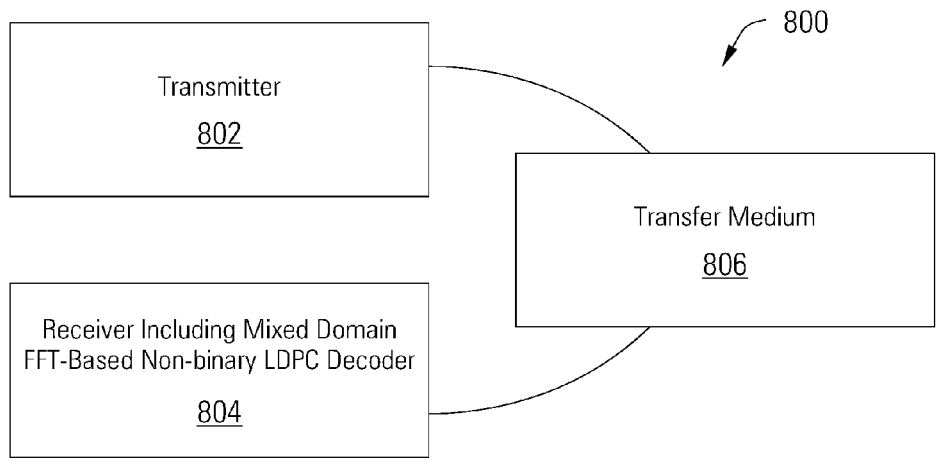
FIG. 8 depicts an example data transmission device including a mixed domain FFT-based non-binary LDPC decoder in accordance with some embodiments of the present invention.

Turning to FIG. 8, a wireless communication system 800 or data transmission device including a receiver 804 with a mixed domain LDPC decoder is shown in accordance with some embodiments of the present invention. Communication system 800 includes a transmitter 802 that is operable to transmit encoded information via a transfer medium 806 as is known in the art. The encoded data is received from transfer medium 806 by receiver 804. Receiver 804 incorporates a mixed domain LDPC decoder. Such a mixed domain LDPC decoder may be implemented consistent with that disclosed above in relation to FIG. 3. In some cases, the decoding may be done consistent with the flow diagram disclosed above in FIG. 5.

The mixed domain LDPC decoder disclosed herein provides excellent error performance with relatively simple hardware primarily using adders, comparators and subtractors, and having much smaller area and power consumption than a purely FFT-based decoder.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel methods and apparatuses for decoding data in a mixed domain FFT-based non-binary LDPC decoder. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for non-binary decoding of low density parity check encoded data comprising:
   a message processing circuit in a low density parity check decoder operable to process variable node messages and check node messages in a log domain;
   a check node calculation circuit in the low density parity check decoder operable to perform a Fast Fourier Transform-based check node calculation in a real domain, wherein the check node calculation circuit comprises:
   a Fast Fourier Transform circuit operable to perform a Fast Fourier Transform on variable node values for a current layer in the real domain:
   a first inverse Fast Fourier Transform circuit operable to perform an inverse Fast Fourier Transform to yield check node values for a connected layer in the real domain; and
   a second inverse Fast Fourier Transform circuit operable to perform an inverse Fast Fourier Transform to yield check node values for the current layer in the real domain;
   and
   wherein the message processing circuit and the check node calculation circuit are operable to perform iterative layer decoding.

2. The apparatus of claim 1, wherein the message processing circuit comprises:
   a summation circuit operable to add variable node values for a connected layer to check node values for the connected layer in the log domain to yield soft log likelihood ratio values of each symbol in a Galois Field for the connected layer;

a shifter operable to shift the soft log likelihood ratio values by a difference between a current layer and the connected layer to yield total soft log likelihood ratio values for the current layer; and a subtraction circuit operable to subtract check node values for the current layer from the total soft log likelihood ratio values for the current layer in the log domain to yield variable node values for the current layer.

3. The apparatus of claim 1, wherein the check node calculation circuit comprises:

a Fast Fourier Transform circuit operable to perform a Fast Fourier Transform on variable node values for a current layer in the real domain;

a magnitude calculation circuit operable to provide magnitudes of output values from the Fast Fourier Transform circuit;

a sign calculation circuit operable to provide signs of the output values from the Fast Fourier Transform circuit; and a check node memory operable to store the magnitudes and the signs.

4. The apparatus of claim 3, wherein the check node calculation circuit further comprises an exponential calculation circuit operable to calculate an exponential value of the magnitudes for a connected layer and to apply the signs to corresponding exponential values.

5. The apparatus of claim 3, wherein the check node calculation circuit further comprises an exponential calculation circuit operable to calculate an exponential value of the magnitudes for the current layer and to apply the signs to corresponding exponential values.

6. The apparatus of claim 1, wherein the check node calculation circuit further comprises a transformation circuit to convert the check node values for the connected layer from the real domain to the log domain.

7. The apparatus of claim 1, wherein the check node calculation circuit further comprises a transformation circuit to convert the check node values for the current layer from the real domain to the log domain.

8. The apparatus of claim 1, further comprising a first transformation circuit operable to convert variable node values for a current layer from the log domain to the real domain.

9. The apparatus of claim 1, wherein the message processing circuit and the check node calculation circuit are implemented as an integrated circuit.

10. The apparatus of claim 1, wherein the apparatus is incorporated in a storage device.

11. The apparatus of claim 1, wherein the apparatus is incorporated in a storage system comprising a redundant array of independent disks.

12. The apparatus of claim 1, wherein the apparatus is incorporated in a data transmission device.

13. A method of decoding data in a mixed domain non-binary low density parity check decoder, comprising:

processing variable node messages and check node messages in the mixed domain low density parity check decoder in a log domain;

transforming variable node messages from the log domain to a real domain;

performing Fast Fourier Transform-based check node calculations on variable node values for a current layer in the real domain, wherein the processing and the check node calculations comprise iterative layer decoding;

performing an inverse Fast Fourier Transform to yield check node values for a current layer in the real domain;

performing an inverse Fast Fourier Transform to yield check node values for a connected layer in the real domain; and transforming the real domain check node values for the current layer and for the connected layer from the real domain to the log domain.

14. The method of claim 13, wherein the processing in the log domain comprises:

adding variable node values for a connected layer to check node values for the connected layer in the log domain to yield soft log likelihood ratio values of each symbol in a Galois Field for the connected layer;

shifting the soft log likelihood ratio values by a difference between a current layer and the connected layer to yield total soft log likelihood ratio values for the current layer; and subtracting check node values for the current layer from the total soft log likelihood ratio values for the current layer in the log domain to yield variable node values for the current layer.

15. The method of claim 13, wherein the check node calculations comprise performing check node calculations on variable node values using Fast Fourier Transforms in the real domain to yield check node values for a connected layer in the real domain and check node values for a current layer in the real domain, and wherein transforming the real domain check node messages comprises transforming the check node values for the connected layer and the check node values for the current layer.

16. A storage system comprising:

a storage medium maintaining a data set;

a write head operable to magnetically record the data set to the storage medium; and a mixed domain non-binary low density parity check decoder operable to perform layered decoding, comprising:

a message processing circuit operable to process variable node messages and check node messages in a log domain; and a check node calculation circuit operable to perform a Fast Fourier Transform-based check node calculation in a real domain, wherein the check node calculation circuit comprises:

a Fast Fourier Transform circuit operable to perform a Fast Fourier Transform on variable node values for a current layer in the real domain;

a first inverse Fast Fourier Transform circuit operable to perform an inverse Fast Fourier Transform to yield check node values for a connected layer in the real domain; and a second inverse Fast Fourier Transform circuit operable to perform an inverse Fast Fourier Transform to yield check node values for the current layer in the real domain.

17. The storage system of claim 16, wherein the message processing circuit comprises:

a summation circuit operable to add variable node values for a connected layer to check node values for the connected layer in the log domain to yield soft log likelihood ratio values of each symbol in a Galois Field for the connected layer;

a shifter operable to shift the soft log likelihood ratio values by a difference between a current layer and the connected layer to yield total soft log likelihood ratio values for the current layer; and a subtraction circuit operable to subtract check node values for the current layer from the total soft log likelihood ratio values for the current layer in the log domain to yield variable node values for the current layer.

18. The storage system of claim 16, wherein the check node calculation circuit comprises:
    a magnitude calculation circuit operable to provide magnitudes of output values from the Fast Fourier Transform circuit;
    a sign calculation circuit operable to provide signs of the output values from the Fast Fourier Transform circuit; and
    a check node memory operable to store the magnitudes and the signs.

19. The storage system of claim 16, wherein the check node calculation circuit further comprises an exponential calculation circuit operable to calculate an exponential value of the magnitudes for a connected layer and to apply the signs to corresponding exponential values.

20. The storage system of claim 16, wherein the check node calculation circuit further comprises an exponential calculation circuit operable to calculate an exponential value of the magnitudes for the current layer and to apply the signs to corresponding exponential values.

* * * * *